United States Patent [19]

Lew

[11] Patent Number: 4,892,593
[45] Date of Patent: Jan. 9, 1990

[54] SOLAR TRAP

[76] Inventor: Hyok S. Lew, 7890 Oak St., Arvada, Colo. 80005

[21] Appl. No.: 141,910

[22] Filed: Jan. 7, 1988

Related U.S. Application Data

[63] Continuation-in-part of Ser. No. 659,227, Oct. 9, 1984, Pat. No. 4,723,535.

[51] Int. Cl.$^4$ ............................ H02N 6/00; F24J 2/18
[52] U.S. Cl. ...................................... 136/246; 136/248
[58] Field of Search ............................... 136/246, 248; 126/439–441

[56] References Cited

U.S. PATENT DOCUMENTS

| | | | |
|---|---|---|---|
| 3,988,166 | 10/1976 | Beam | 136/246 |
| 4,002,499 | 1/1977 | Winston | 136/206 |
| 4,045,246 | 8/1977 | Mlavsky et al. | 136/246 |
| 4,069,812 | 1/1978 | O'Neill | 136/246 |

OTHER PUBLICATIONS

R. Mertens, "Photovoltaic Generators Using Optical Concentration", *Proceedings 2nd European Community Photovoltaic Solar Energy Conference* (1979), Reidel Pub. Co. (1979), pp. 496–506.

*Primary Examiner*—Aaron Weisstuch

[57] ABSTRACT

The solar energy collector of the present invention comprises a light funneling through including a pair of light reflecting surfaces extending from an apex line in a oblique angle, a two dimensional Fresnel lens covering the opening of the trough at the diverging end and a photovolatic panel disposed in the light funneling trough adjacent to the apex line and generally parallel to the chord line connecting the diverging extremities of the two light reflecting surfaces, which combination may further include one or more dual sided light reflecting sheets or panels disposed radially intermediate the two light reflecting surfaces and a transparent partition disposed parallel to the apex line intermediate the Fresnel lens and the photovoltaic panel, wherein the solar energy entering the solar energy collector is collected in the form of electricity by the photovoltaic panel and in the form of thermal energy by the fluid circulated through the space between the transparent partition and the photovoltaic panel.

10 Claims, 1 Drawing Sheet

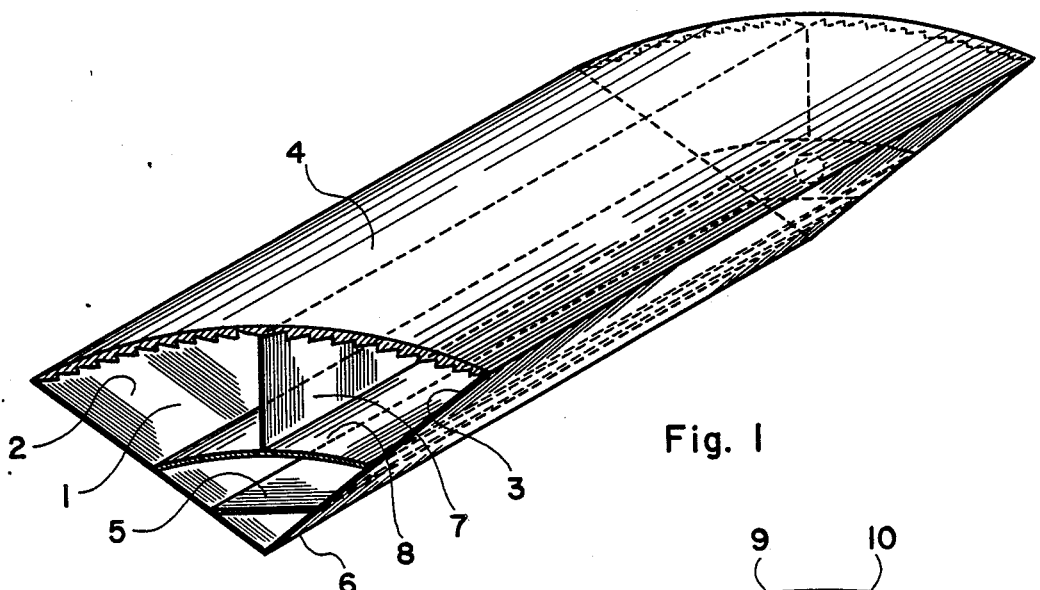
Fig. 1
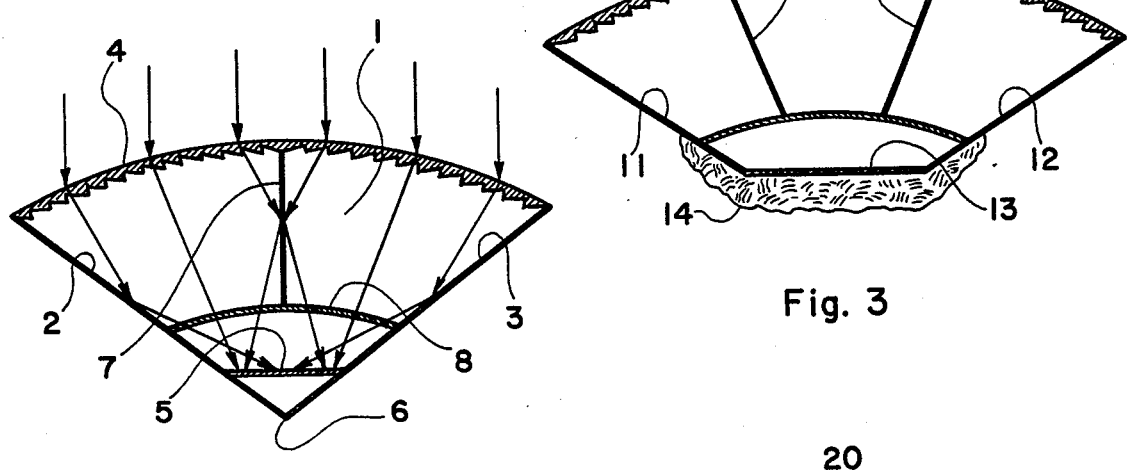
Fig. 2
Fig. 3
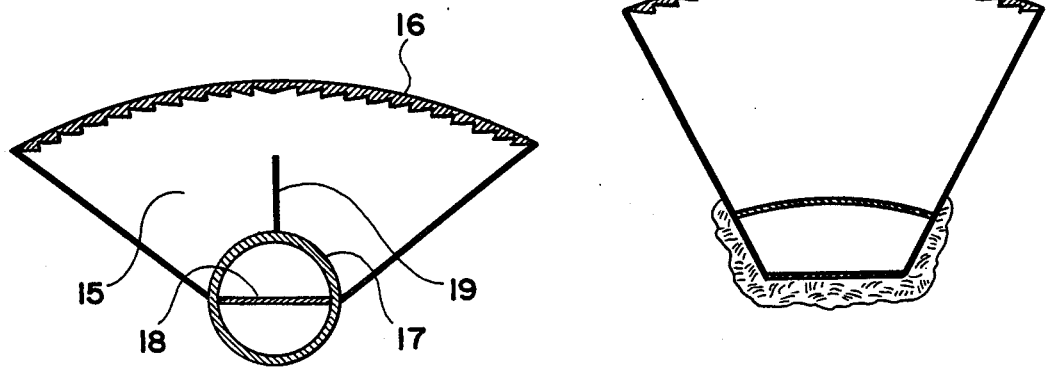
Fig. 4
Fig. 5

4,892,593

SOLAR TRAP

BACKGROUND OF THE INVENTION

This patent application is a continuation-in-part application of patent application Ser. No. 06/659,227 entitled "Solar Trap" filed on Oct. 9, 1984, now U.S. Pat. No. 4,723,535 issued Feb. 19, 1988.

As described in the aforementioned parent application, the light funneling trough covered with a two dimensional Fresnel lens provides one of the most economic and practical methods for concentrating solar energy in the art of solar energy collectors. In most solar thermal energy applications, the required temperature is beyond the temperature of the solar thermal energy collected by flat collectors and consequently, a concentrating solar energy collector is required. The parent application of this patent application has provided a highly economic and practical concentrating solar energy collector employing a light funneling trough covered with a two dimensional Fresnel lens, which satisfies the requirement of high temperature in solar thermal energy collection. The cost of photovoltaic panels is very high, which high cost is the obstacle to the widespread use of solar voltaic energy collectors. One way to reducing the cost of solar voltaic energy collectors is to employ a sunlight concentrating device that drastically reduces the required surface area of the photovoltaic cells.

BRIEF SUMMARY OF THE INVENTION

The primary object of the present invention is to provide a solar energy collector that directs the sunlight in a concentrated state onto the photovoltaic panel.

Another object is to provide a concentrating solar energy collector collecting the solar energy in the form of electricity as well a in the form of heat.

A further object is to provide a solar energy collector comprising a light funneling trough covered with a two dimensional Fresnel lens and a photovoltaic panel facing the Fresnel lens disposed adjacent and parallel to the apex of the light funneling trough.

Yet another object is to provide a solar energy collector comprising the photovoltaic panel disposed in the light funneling trough with a two dimensional Fresnel lens cover, which further includes one or more dual sided light reflecting partitions radially disposed intermediate the two light reflecting surfaces constituting the light funneling trough.

Yet a further object is to provide a solar energy collector comprising the photovoltaic panel disposed in the light funneling trough with a two dimensional Fresnel lens cover, which further includes a transparent partition disposed intermediate the Fresnel lens and the photovoltaic panel, wherein fluid circulated through the space intermediate the transparent partition and photovoltaic panel collects thermal energy from sunlight, while the photovoltaic panel collects electrical energy from sunlight.

These and other objects of the present invention will become clear as the description thereof progresses.

BRIEF DESCRIPTION OF THE FIGURES

The present invention may be described with great clarity and specificity by referring to the following figures:

FIG. 1 illustrates a perspective view of an embodiment of the solar energy collector constructed in accordance with the principles of the present invention.

FIG. 2 illustrates a cross section of the embodiment shown in FIG. 1.

FIG. 3 illustrates a cross section of another embodiment of the solar energy collector of the present invention.

FIG. 4 illustrates a cross section of a further embodiment of the solar energy collector of the present invention.

FIG. 5 illustrates a cross section of yet another embodiment of the solar energy collector of the present invention.

DESCRIPTION OF THE ILLUSTRATED EMBODIMENTS

In FIG. 1 there is illustrated a perspective view of an embodiment of the solar trap constructed in accordance with the principles of the present invention, that comprises a light funneling trough 1 including a pair of light reflecting surfaces 2 and 3 arranged into a trough and a two dimensional Fresnel lens 4 covering the opening of the trough at the diverging end, and a photovoltaic panel 5 facing the opening of the light funneling trough 1, which is disposed within the light funneling trough 1 in a parallel relationship with respect to the apex line 6 of the light funneling trough 1. The solar energy collector further includes a dual-sided light reflecting sheet or panel 7 disposed radially intermediate the two light reflecting surfaces 2 and 3, and a transparent partition 8 disposed intermediate the two dimensional Fresnel lens 4 and the photovoltaic panel 5, which partition divides the interior space of the solar collector into two compartments in a generally leak-proof arrangement.

In FIG. 2 there is illustrated a cross section of the solar trap shown in FIG. 1, which cross section is taken along a plane perpendicular to the apex line 6 of the light funneling trough 1. The sunlight entering the light funneling trough 1 is refracted by the two dimensional Fresnel lens 4 into directions approximately converging towards the photovaltaic panel 5 disposed adjacent to the apex line 6 of the light funneling trough 1, which sunlight so refracted is funneled towards the photovoltaic panel 5 by the two light reflecting surfaces 2 and 3 as well as by the dual-sided light reflecting sheet 7 until all of the sunlight entering the solar energy collector irradiates the photovoltaic panel 5. The concentrated sunlight irradiating photovoltaic panel 5 is converted to electrical energy by the photovoltaic panel 5 and to thermal energy that heats the heat transfer fluid circulated through the space intermediate the transparent partition 8 and the photovoltaic panel 5, which heat transfer fluid is heated by the greenhouse effect provided by the transparent partition 8 as well as by the photovoltaic panel 5 heated by the sunlight. The solar energy collector of the present invention shown in FIGS. 1 and 2 provides the following advantages over other existing arts of solar energy collecting technology: Firstly, the light funneling trough of the present invention does not require any high degree of accuracy and precision in the geometry and construction thereof. As a consequence, it provides a highly economic and lightweight solar concentrator collecting the solar energy at the concentrated level. Secondly, the solar trap of the present invention converts solar energy to electrical energy at a concentrated state and, consequently, it reduces the required surface area of the photovoltaic panel, which drastically lowers the cost of the electricity obtained from the solar energy. Thirdly, the solar trap of the present invention collects thermal energy from the sunlight at a significantly elevated temperature and consequently, it greatly improves the versatility of the solar thermal energy applications. Lastly, the solar trap of the present invention provides electricity as well as heat, which dual function provides low initial capital cost, high user convenience and improved operating efficiency of the solar collector. The solar trap of the present invention is a perfect solar energy collector for all domestic uses as well as many industrial applications. It should be mentioned that the portions of the light reflecting surfaces 2 and 3 intermediate the photovoltaic panel 5 and the apex line 6 may be omitted. Of course, the interior space of the triangular cross section intermediate the photovoltaic panel 5 and the apex line 6 may be used as a return flow passage for the heat transfer fluid after thermally insulating the outer surface of the light funneling trough adjacent to the apex line 6.

In FIG. 3 there is illustrated a cross section of another embodiment of the solar trap having essentially the same construction as the embodiment shown in FIG. 2 with two exceptions. This solar trap 9 has two dual-sided light reflecting sheets 9 and 10 which divide the light funneling trough into three sub-light funneling troughs instead of the two sub-light funneling troughs shown in FIG. 1. The portions of the one-sided light reflecting surfaces 11 and 12 extending beyond the photovoltaic panel 13 towards the apex line are omitted, wherein the exterior surfaces of the solar trap adjacent to the photovoltaic panel 13 are thermally insulated by an insulating material 14.

In FIG. 4 there is illustrated a cross section of a further embodiment of the solar trap, that comprises a light funneling trough 15 including a two dimensional Fresnel lens 16 at the diverging extremity and a transparent tubing 17 at the converging extremity, which transparent tubing 17 includes a photovoltaic panel 18 facing the diverging extremity of the light funneling trough 15 and disposed across the cross section thereof. The dual-sided light reflecting sheet 19 partially extending from the transparent tubing 17 in a radial direction may be included in order to increase the concentration of the sunlight or to employ a Fresnel lens of poor light focusing capability. Of course, the apex zone of the solar trap may be thermally insulated as shown in FIG. 3.

In FIG. 5 there is illustrated a cross section of yet another embodiment of the solar trap having the same construction as the embodiment shown in FIG. 3 with one exception being that the dual-sided light reflecting sheets disposed radially within the light funneling trough are now omitted. This embodiment is desirable when the two dimensional Fresnel lens 20 has a high quality light focusing capability.

While the principles of the invention have now been made clear by the illustrative embodiments, there will be immediately obvious to those skilled in the art many modifications of the structures, arrangements, proportions, elements and materials which are particularly adapted to the specific working environments and operating conditions in the practice of the invention without departing from those principles. It is not desired to limit the inventions to the particular illustrated embodiments shown and described and, accordingly, all suitable modifications and equivalents may be resorted to falling within the scope of the inventions as defined by the claims which follow.

The embodiments of the invention, in which an exclusive property or privilege is claimed, are defined as follows:

1. A solar energy collecting apparatus comprising in combination:
    (a) a light funneling trough including two flat light reflecting surfaces disposed in a face-to-face arrangement having an oblique angle therebetween;
    (b) a two dimensional Fresnel lens covering the opening of the light funneling trough at the diverging extremity thereof;
    (c) a photovoltaic panel facing the two dimensional Fresnel lens disposed adjacent to the converging extremity of the light funneling trough; and
    (d) at least one dual-sided light reflecting planar member disposed radially intermediate the two light reflecting surfaces, said dual-sided light reflecting planar member extending from the converging extremity of the light funneling trough towards the diverging extremity thereof and terminated at a substantial distance away from the plane including the opening of the light funneling trough;
wherein the sunlight entering the light funneling trough through the two-dimensional Fresnel lens is refracted by the two dimensional Fresnel lens and funneled by the light funneling trough towards the converging extremity of the light funneling trough and irradiates the photovoltaic panel.

2. The combination as set forth in claim 1 wherein said combination includes a transparent partition dividing the interior space of the light funneling trough into a first compartment adjacent to the two dimensional Fresnel lens and a second compartment adjacent to the photovoltaic panel for circulating a heat transfer fluid through said second compartment.

3. The combination as set forth in claim 2 wherein the dual-sided light reflecting planar member extends from the transparent partition.

4. The combination as set forth in claim 2 wherein the exterior of the apparatus is thermally insulated about the converging extremity of the light funneling trough.

5. The combination as set forth in claim 2 wherein the light funneling trough includes a third compartment intermediate a closed converging extremity of the light funneling trough and the photovoltaic panel for circulating a heat transfer fluid therethrough.

6. A solar energy collecting apparatus comprising in combination:
    (a) a light funneling trough including two flat light reflecting surfaces disposed in a face-to-face arrangement having an oblique angle therebetween;
    (b) a two dimensional Fresnel lens covering the opening of the light funneling trough at the diverging extremity thereof;
    (c) a tubing with a generally circular cross section disposed adjacent to the converging extremity of the light funneling trough, wherein at least a portion of the cross section of the tubing facing the two dimensional Fresnel lens is transparent; and
    (d) a photovoltaic panel facing the two dimensional Fresnel lens disposed within the tubing following the length thereof and diametrically thereacross in cross section, wherein the combination of the tubing and the photovoltaic panel provides at least two parallel flow passages for circulating a heat transfer fluid;
wherein the sunlight entering the light funneling trough through the two dimensional Fresnel lens is refracted by the two dimensional Fresnel lens and funneled by the light funneling trough towards the converging extremity of the light funneling trough and irradiates the photovoltaic panel.

7. The combination as set forth in claim 6 wherein the apparatus is thermally insulated about the converging extremity of the light funneling trough.

8. The combination as set forth in claim 6 wherein said combination includes at least one dual-sided light reflecting planar member disposed radially intermediate the two light reflecting surfaces.

9. The combination as set forth in claim 8 wherein the dual-sided light reflecting planar member extends from the transparent tubing towards the two dimensional Fresnel lens.

10. The combination as set forth in claim 9 wherein the dual-sided light reflecting planar member is terminated at a substantial distance away from the plane including the opening of the light funneling trough.

* * * * *